(12) United States Patent
Douglas et al.

(10) Patent No.: US 9,184,022 B2
(45) Date of Patent: Nov. 10, 2015

(54) METHOD AND APPARATUS FOR CONTROL OF COHERENT SYNCHROTRON RADIATION EFFECTS DURING RECIRCULATION WITH BUNCH COMPRESSION

(71) Applicant: JEFFERSON SCIENCE ASSOCIATES, LLC, Newport News, VA (US)

(72) Inventors: David R. Douglas, Yorktown, VA (US); Christopher Tennant, Williamsburg, VA (US)

(73) Assignee: JEFFERSON SCIENCE ASSOCIATES, LLC, Newport News, VA (US)

( * ) Notice: Subject to any disclaimer, the term of this patent is extended or adjusted under 35 U.S.C. 154(b) by 0 days.

(21) Appl. No.: 14/526,616

(22) Filed: Oct. 29, 2014

(65) Prior Publication Data

US 2015/0228444 A1 Aug. 13, 2015

Related U.S. Application Data

(60) Provisional application No. 61/910,208, filed on Nov. 29, 2013.

(51) Int. Cl.
*G21K 5/04* (2006.01)
*H01J 37/147* (2006.01)

(52) U.S. Cl.
CPC ......... *H01J 37/147* (2013.01); *H01J 2237/049* (2013.01); *H01J 2237/152* (2013.01)

(58) Field of Classification Search
USPC ........ 250/396 R, 397, 396 ML, 492.1, 492.3; 315/500, 501, 502, 503, 504, 505
See application file for complete search history.

(56) References Cited

U.S. PATENT DOCUMENTS

2005/0226383 A1* 10/2005 Rifkin .............. G02B 5/10
378/119

OTHER PUBLICATIONS

Di Mitri, S. et al., Cancellation of Coherent Synchrotron Radiation Kicks with Optical Balance, Jan. 2, 2013, pp. 1-4, vol. 110, No. 014801, Physical Review Letters, US.
Valloni, A et al., Strawman Optics Design for the LHeC ERL Test Facility, May 2013, pp. 1694-1696, vol. TUPME055, Proceedings IPAC 2013, Shanghai, China.

* cited by examiner

*Primary Examiner* — Nicole Ippolito

(57) ABSTRACT

A modulated-bending recirculating system that avoids CSR-driven breakdown in emittance compensation by redistributing the bending along the beamline. The modulated-bending recirculating system includes a) larger angles of bending in initial FODO cells, thereby enhancing the impact of CSR early on in the beam line while the bunch is long, and 2) a decreased bending angle in the final FODO cells, reducing the effect of CSR while the bunch is short. The invention describes a method for controlling the effects of CSR during recirculation and bunch compression including a) correcting chromatic aberrations, b) correcting lattice and CSR-induced curvature in the longitudinal phase space by compensating $T_{566}$, and c) using lattice perturbations to compensate obvious linear correlations x-dp/p and x'-dp/p.

4 Claims, 2 Drawing Sheets

METHOD AND APPARATUS FOR CONTROL OF COHERENT SYNCHROTRON RADIATION EFFECTS DURING RECIRCULATION WITH BUNCH COMPRESSION

This application claims the priority of Provisional U.S. Patent Application Ser. No. 61/910,208 filed Nov. 29, 2013.

The United States Government may have certain rights to this invention under Management and Operating Contract No. DE-AC05-06OR23177 from the Department of Energy.

FIELD OF THE INVENTION

The present invention relates to energy recovery linear accelerators (ERL), and more particularly to controlling coherent synchrotron radiation (CSR) effects on a charged particle beam during recirculation with bunch compression.

BACKGROUND OF THE INVENTION

Numerous recent proposals such as JLAMP (JLab AMPlifier), a 4th generation light source covering the range 10 eV-100 eV in the fundamental mode with harmonics to 1 keV, and the LHeC (Large Hadron Electron Collider) Test ERL have invoked recirculation and energy recovery as a means of cost-performance optimization for linear accelerators. Use of such systems as free-electron laser (FEL) drivers can be challenging because of the combination of the deleterious impact of coherent synchrotron radiation (CSR) on beam quality during recirculation and bunch compression, and the desirability of limiting machine size and complexity.

A conventional recirculation arc 10 based on an alternating gradient second order achromatic "FODO" transport is shown in FIG. 1. The conventional recirculation arc 10 includes a sequence of quadrupole focusing and defocusing lenses 12 interleaved with bending dipole magnets 14 with rational betatron phase advances chosen to add up to an integer full phase advance over the entire arc.

As the momentum compaction of the recirculation arc 10 is nonzero, it will lead to changes in the length of an energy-chirped beam. If the chirp is generated by acceleration on the rising side of the RF waveform, the bunch will lengthen; if the chirp is generated by acceleration on the falling side of the RF waveform, the bunch will be compressed in length. Although this latter $M_{56}>0$ compression has certain advantages, if employed as a means of final bunch compression, the impact of CSR is in this apparatus both dramatic and detrimental.

Accordingly, it would be desirable to provide a method and apparatus that for bunch length compression during recirculation while also limiting and controlling beam quality degradation due to CSR.

OBJECT OF THE INVENTION

It is therefore an object of the present invention to provide a method and apparatus for controlling coherent synchrotron radiation (CSR) effects in a charged particle beam during recirculation with bunch compression.

SUMMARY OF THE INVENTION

According to the present invention there is provided a modulated-bending recirculating system that, by redistributing the bending along the beamline, avoids a CSR-caused breakdown in beam-transport symmetry-base emittance compensation such as that described in S. Di Mitri, M. Cornacchia, and S. Spampinati, "Cancellation of Coherent Synchrotron Radiation Kicks with Optics Balance", Phys. Rev. Lett. 110, 014801, 2 Jan. 2013. The modulated-bending recirculating system for CSR-caused breakdown in emittance compensation includes a) larger angles of bending in initial FODO cells—thereby enhancing the impact of CSR early on in the beam line while the bunch is long, and 2) a decreased bending angle in the final FODO cells, reducing the effect of CSR while the bunch is short. The invention describes a method for controlling the effects of CSR during recirculation and bunch compression including a) correcting chromatic aberrations, b) correcting lattice and CSR-induced curvature in the longitudinal phase space by compensating $T_{566}$, and c) using lattice perturbations to compensate obvious linear correlations x-dp/p and x'-dp/p.

DETAILED DESCRIPTION

The current invention is a method and apparatus that provides bunch length compression during recirculation in a modest footprint, approximately 10 meter diameter, at energies of order 1 GeV, while limiting and controlling beam quality degradation due to CSR. The method is scalable to higher energy by increasing the machine diameter.

As an example, we have modeled the effect of a 0.71 GeV recirculation arc comprising eight quarter-integer FODO cells during compression of a 200 pC, 1 mm-mrad normalized emittance beam while bending through 180° using an orbit radius in the bends of 2 m. The beam transverse normalized emittance increases dramatically in the bending plane; the magnitude grows from 1 to 12.5 mm-mrad as a consequence of phase space redistribution driven by the CSR interaction.

Figure 1:
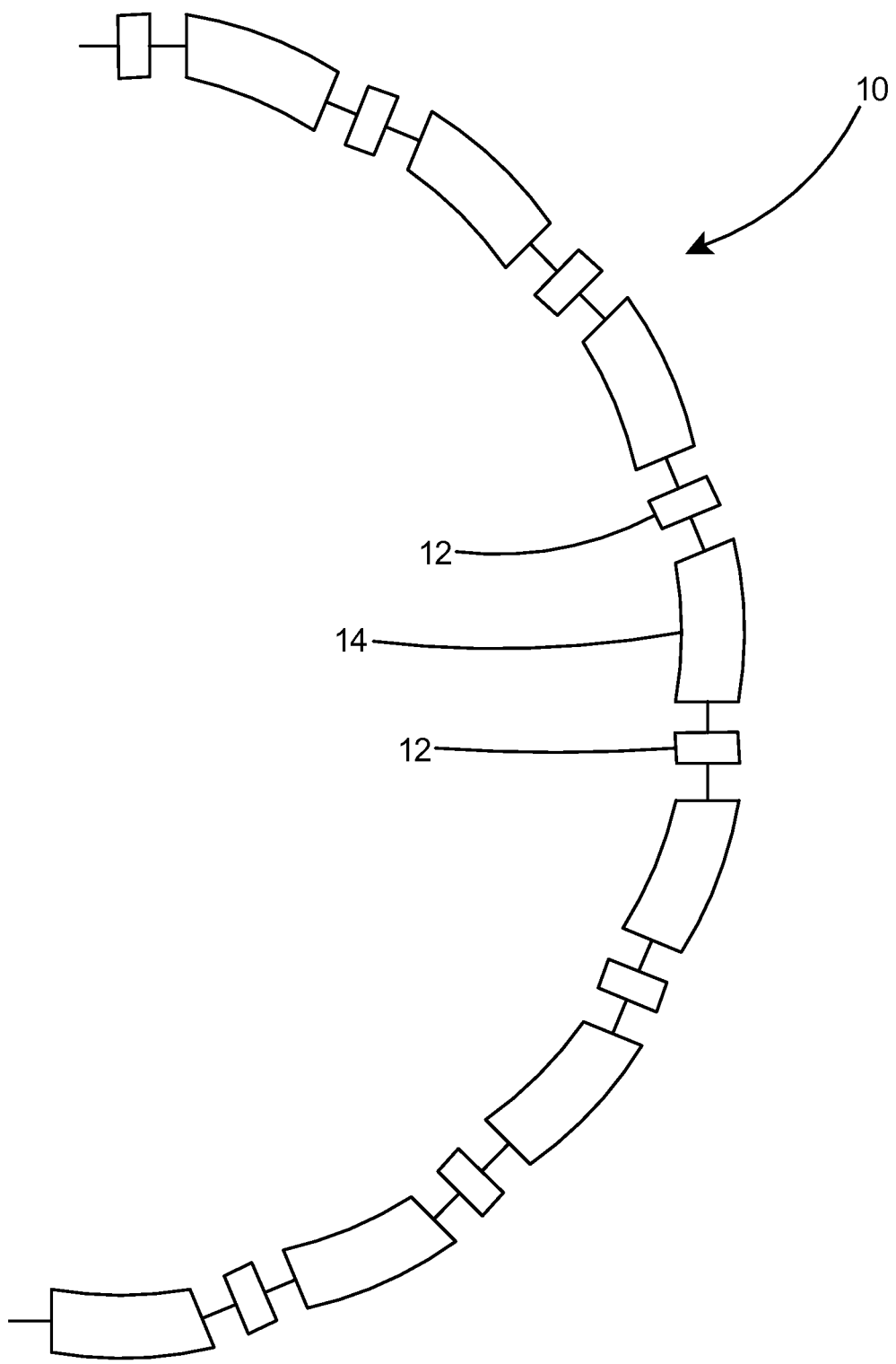
FIG. 1 is a schematic depicting the layout of a conventional ERL recirculation arc.

In a conventional recirculation arc 10 as shown in FIG. 1, the impact of CSR significantly degrades performance. This degradation can be reduced by:

1) correcting chromatic aberrations, preferably by making the arc a second-order achromat;
2) correcting lattice and CSR-induced curvature in the longitudinal phase space (compensate $T_{566}$); and
3) using lattice perturbations to compensate obvious linear correlations x-dp/p and x'-dp/p (introduce compensatory dispersion trims).

Even after carrying out the above adjustments, the output emittance was of order 4 mm-mrad, an increase of 3 mm-mrad, or by a factor of four.

The cause of the phase space redistribution is clear: as the bunch compresses, the energy shifts across the bunch due to dramatically increasing CSR effects. As a result, the symmetry-based compensation described by diMitri et al. (op. cit.) breaks down, despite the presence of desirable betatron phase and amplitude relationships: the small shifts introduced when the bunch is long are inadequate to offset the much larger shifts induced when the bunch is short.

It has been discovered, however, that this breakdown in emittance compensation can be mitigated by appropriate redistribution of bending along the beamline. The method for this compensation includes: a) increasing the angle of bending in initial FODO cells—thereby enhancing the impact of CSR early on in the beam line while the bunch is long, and b)

decreasing the bending angle in the final FODO cells, thereby reducing the effect of CSR while the bunch is short.

Figure 2:
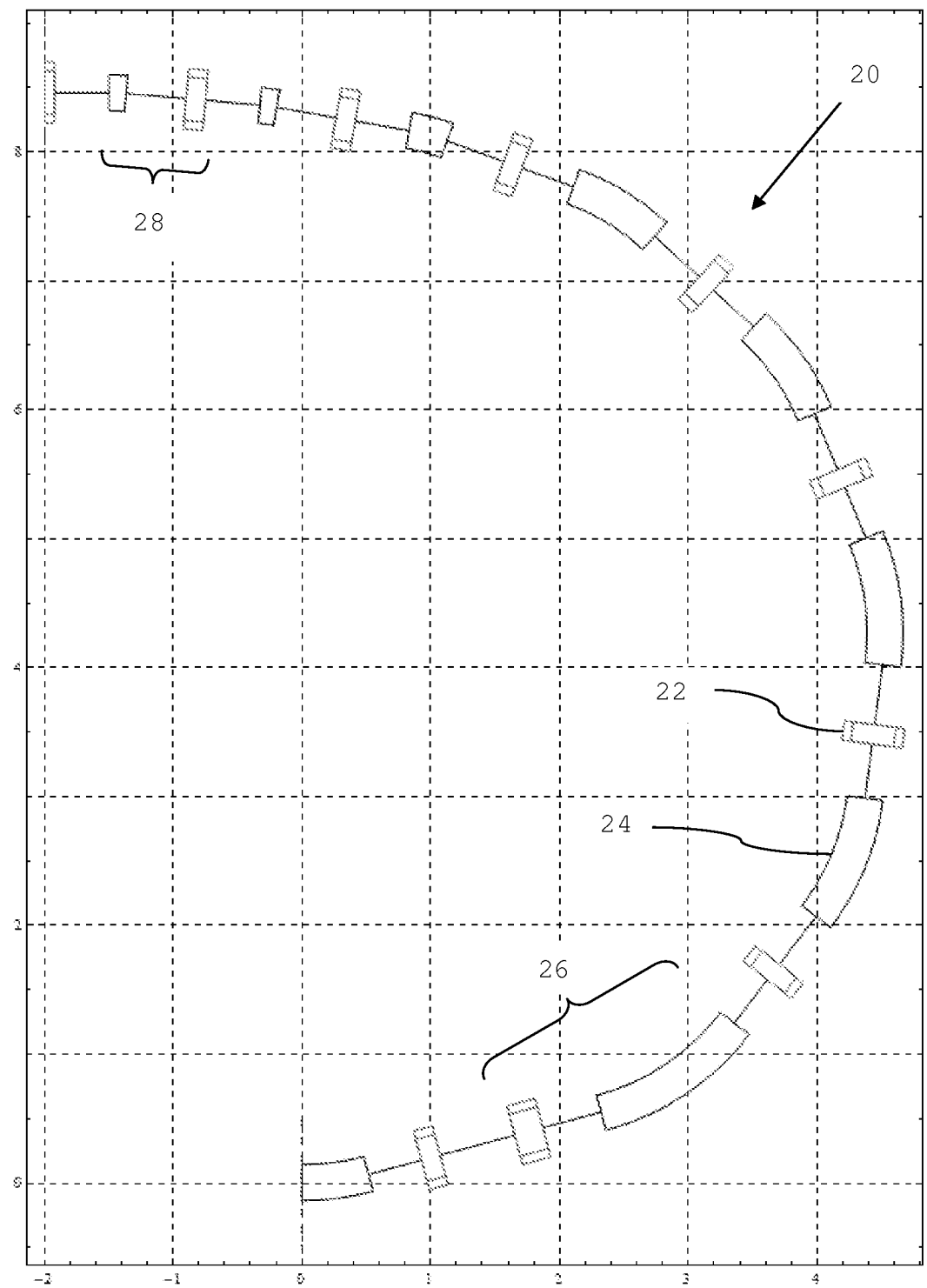
FIG. 2 is a schematic depicting a preferred embodiment of a bending modulated recirculating system according to the present invention.

With reference to FIG. 2, initial simulations of the bending modulated recirculating system 20 of the present invention showed immediate benefit. The bending modulated recirculating system 20 includes a plurality of focusing and defocusing (FODO) cells arrayed in a recirculating arc. Each of the FODO cells includes a quadrupole magnet 22 and a dipole magnet 24. In a bending modulated recirculating system 20 according to the present invention, the initial FODO cells 26 include larger bend angles than the bend angles in the final FODO cells 28.

In comparison to the 8×22.5° bend in the conventional recirculation arc shown in FIG. 1, the bending modulated recirculating system 20 with a linearly declining bend, using dipoles 26 of 40, 35, 30, 25 . . . 10, and 5 degrees, presented less than half the emittance degradation. The results of a simulation-based numerical experiment made it clear that care in selection of the bend distribution can reduce the emittance dilution.

As in the conventional FODO transport, the degraded phase space presented distortions that were correlated and that therefore could be readily compensated by deliberately perturbing the beam line optics so as to suppress the correlations. Individual cells are chromaticity corrected, and longitudinal phase space curvature induced by both the lattice and CSR are compensated in the incoming beam, and spatial/energy correlations (x-dp/p and x'-dp/p) are compensated, as described hereinabove. This could in both cases be accomplished not only nonlinearly, but by using simple linear perturbations.

A combination of optimizing the choice of bend distribution and the suppression of CSR-induced correlations in the beam then resulted in growth of normalized emittance from 1 to 2 mm-mrad using a FODO lattice otherwise similar to the benchmark FODO. This output is better by a factor of two than the output of a conventional FODO system, in which exhibited the emittance increase was a factor of 3 times larger than that observed during simulation of the modulated-bending system.

Further improvement is potentially possible through use of modern optimization methods, such as genetic algorithms. The proposed layout of the bending modulated recirculating system 20 is shown in FIG. 2. Although this solution is a demonstration of the method in a modest footprint of approximately 10 m; it is not fully optimized with regard to distribution of bending, choice of betatron match, or lattice parameters. This method can be extended to higher energy and is therefore of use in proposed XFEL (x-ray free electron laser) and XFELO (x-ray free electron laser oscillator) drivers.

A method and apparatus for control of CSR effects during recirculation with bunch compression uses uniform length FODO cells with declining bend angles. Additional analysis has demonstrated similar, potentially greater, effectiveness in a compressor/recirculator using FODO cells with length correlated to the dipole angle, i.e., shorter cells 28 when using smaller bend angles, such as shown in FIG. 2, and longer cells 26 when using the larger bend angles. This choice will, in principle reduce the lattice betatron response to CSR-driven effects when the bunch is short, thereby providing an additional parameter that can be used to balance and compensate degradation as the bunch is compressed.

What is claimed is:

1. A method for controlling coherent synchrotron radiation (CSR) effects on a charged particle beam during recirculation with bunch compression comprising:
   providing a plurality of focusing and defocusing (FODO) cells arrayed in a recirculating arc including initial FODO cells and final FODO cells;
   providing a larger bending angle in said initial FODO cells to enhance the impact of CSR early on in the beam line while the bunch is long; and
   providing a smaller bending angle in the final FODO cells to reduce the effect of CSR while the bunch is short.

2. The method of claim 1, wherein each of said FODO cells are of uniform length.

3. The method of claim 1, wherein each of said FODO cells includes a length correlated to the dipole angle.

4. The method of claim 1, wherein said final FODO cells are of shorter length than the length of said initial FODO cells.

* * * * *